(12) United States Patent
Nakata

(10) Patent No.: US 7,602,035 B2
(45) Date of Patent: Oct. 13, 2009

(54) LIGHT EMITTING OR LIGHT RECEIVING SEMICONDUCTOR MODULE AND METHOD FOR MANUFACTURING SAME

(76) Inventor: Josuke Nakata, 29-3, Goryoooeyama-cho, 4-chome, Nishikyo-ku, Kyoto-shi, Kyoto, 610-1102 (JP)

( * ) Notice: Subject to any disclaimer, the term of this patent is extended or adjusted under 35 U.S.C. 154(b) by 239 days.

(21) Appl. No.: 10/492,561

(22) PCT Filed: Oct. 19, 2001

(86) PCT No.: PCT/JP01/09234

§ 371 (c)(1),
(2), (4) Date: May 3, 2004

(87) PCT Pub. No.: WO03/036731

PCT Pub. Date: May 1, 2003

(65) Prior Publication Data

US 2005/0127379 A1    Jun. 16, 2005

(51) Int. Cl.
  H01L 31/058    (2006.01)
  H01L 31/00     (2006.01)
  H02N 6/00      (2006.01)
(52) U.S. Cl. .......... 257/456; 257/466; 257/E25.02; 257/E31.038; 136/243; 136/246; 136/250
(58) Field of Classification Search ........... 257/459, 257/466, E25.02; 136/243, 246, 250
See application file for complete search history.

(56) References Cited

U.S. PATENT DOCUMENTS

| | | | |
|---|---|---|---|
| 3,038,952 A | | 6/1962 | Ralph |
| 3,350,775 A | | 11/1967 | Iles |
| 3,433,676 A | | 3/1969 | Stein |
| 3,574,925 A | * | 4/1971 | Schneider et al. ...... 228/180.21 |
| 3,630,627 A | * | 12/1971 | Low et al. ............... 356/222 |
| 3,998,659 A | | 12/1976 | Wakefield |
| 3,999,283 A | * | 12/1976 | Dean et al. .............. 438/65 |
| 4,021,323 A | | 5/1977 | Kilby et al. |
| 4,126,812 A | | 11/1978 | Wakefield |
| 4,224,081 A | | 9/1980 | Kawamura et al. |

(Continued)

FOREIGN PATENT DOCUMENTS

EP    0 866 506    9/1998

(Continued)

*Primary Examiner*—Charles D. Garber
*Assistant Examiner*—Ron E Pompey
(74) *Attorney, Agent, or Firm*—Jordan and Hamburg LLP

(57) ABSTRACT

A solar module 20 comprises first and second sheets 21 and 22, a plurality of rows (a plurality of groups) of spherical solar cells 11 incorporated in between these sheets 21 and 22 in a state in which the conduction direction is perpendicular to the surface of the sheets, a mechanism for the parallel connection of each group of spherical solar cells 11, a mechanism for the serial connection of each group of spherical solar cells 11 with the spherical solar cells 11 in adjacent groups, a positive electrode terminal 23, and a negative electrode terminal 24. A positive electrode is formed on the bottom and a negative electrode on top in the odd-numbered rows of spherical solar cells 11 from the left end, while a positive electrode is formed on top and a negative electrode on the bottom in the even-numbered rows of spherical solar cells 11.

25 Claims, 11 Drawing Sheets

U.S. PATENT DOCUMENTS

| | | | | |
|---|---|---|---|---|
| 4,334,354 | A * | 6/1982 | Luft et al. | 29/840 |
| 4,513,167 | A * | 4/1985 | Brandstetter | 136/244 |
| 4,581,103 | A | 4/1986 | Levine et al. | |
| 4,582,588 | A | 4/1986 | Jensen et al. | |
| 4,583,588 | A | 4/1986 | Franzolini et al. | |
| 4,585,537 | A * | 4/1986 | Nakayama et al. | 427/570 |
| 4,638,110 | A * | 1/1987 | Erbert | 136/246 |
| 4,691,076 | A | 9/1987 | Levine et al. | |
| 4,832,755 | A * | 5/1989 | Barton et al. | 136/251 |
| 5,028,546 | A | 7/1991 | Hotchkiss | |
| 5,419,782 | A | 5/1995 | Levine et al. | |
| 5,428,249 | A | 6/1995 | Sawayama et al. | |
| 5,431,127 | A | 7/1995 | Stevens | |
| 5,469,020 | A | 11/1995 | Herrick | |
| 5,498,576 | A | 3/1996 | Hotchkiss et al. | |
| 5,538,902 | A | 7/1996 | Izu et al. | |
| 5,595,607 | A * | 1/1997 | Wenham et al. | 136/244 |
| 6,204,545 | B1 | 3/2001 | Nakata | |
| 6,265,242 | B1 | 7/2001 | Komori et al. | |
| 6,294,822 | B1 | 9/2001 | Nakata | |
| 6,355,873 | B1 | 3/2002 | Ishikawa | |
| 6,744,073 | B1 | 6/2004 | Nakata | |
| 7,109,528 | B2 | 9/2006 | Nakata | |
| 2004/0238833 | A1 | 12/2004 | Nakata | |
| 2005/0067622 | A1 | 3/2005 | Nakata | |
| 2005/0127379 | A1 | 6/2005 | Nakata | |
| 2006/0043390 | A1 | 3/2006 | Nakata | |
| 2006/0086384 | A1 | 4/2006 | Nakata | |
| 2006/0133073 | A1 | 6/2006 | Nakata et al. | |
| 2006/0169992 | A1 | 8/2006 | Nakata | |

FOREIGN PATENT DOCUMENTS

| | | |
|---|---|---|
| EP | 0 982 780 | 3/2000 |
| EP | 1 255 303 | 11/2002 |
| GB | 1195547 | 6/1970 |
| JP | 1-179374 | 7/1989 |
| JP | 5-36997 | 2/1993 |
| JP | 6-013633 | 1/1994 |
| JP | 8-199513 | 8/1996 |
| JP | 9-49213 | 2/1997 |
| JP | 9-162434 | 6/1997 |
| JP | 09-162434 | 6/1997 |
| JP | 10-33969 | 2/1998 |
| JP | 2000-22184 | 1/2000 |
| JP | 2000-259992 | 9/2000 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | 96/03775 | 2/1996 |
| WO | 98/15983 | 4/1998 |
| WO | WO-98/36461 | 8/1998 |
| WO | 99/10935 | 3/1999 |
| WO | WO-01/99202 | 12/2001 |

* cited by examiner

LIGHT EMITTING OR LIGHT RECEIVING SEMICONDUCTOR MODULE AND METHOD FOR MANUFACTURING SAME

TECHNICAL FIELD

This invention relates to a light-emitting or light-receiving semiconductor module and a method for manufacturing the same, and more particularly relates to a structure in which a plurality of granular semiconductor cells having a pair of electrodes and a pn junction are incorporated between each pair of sheets, and these plurality of semiconductor cells are connected serially and in parallel, and to a method for manufacturing this module. This semiconductor module can be used in a wide variety of applications, such as solar cell panels, illumination panels, displays, and semiconductor photocatalysts.

BACKGROUND OF THE INVENTION

Research has been conducted in the past into forming a pn junction via a diffusion layer on the surface of small-diameter spherical semiconductor elements composed of p or n type semiconductors, and connecting many of these semiconductor elements in parallel to a common electrode for use in a solar cell.

U.S. Pat. No. 3,998,659 discusses a case in which a p type diffusion layer is formed on the surface of an n type spherical semiconductor, the diffusion layers of numerous spherical semiconductors are connected to a common film electrode (positive electrode), and the n type cores of numerous spherical semiconductors are connected to a common film electrode (negative electrode) to constitute a solar cell.

U.S. Pat. No. 4,021,323 discloses a solar energy converter (semiconductor module) in which p type spherical semiconductor elements and n type spherical semiconductor elements are laid out serially, these semiconductor elements are connected to a common film electrode, the diffusion layers of these spherical semiconductors are brought into contact with a common electrolyte, and this product is illuminated with sunlight to subject the electrolyte to electrolysis.

With the modules featuring spherical cells discussed in U.S. Pat. Nos. 4,583,588 and 5,469,020, each spherical cell is attached by connection to a common sheet-form electrode, so this is suited to the parallel connection of a plurality of spherical cells, but not to the serial connection of a plurality of spherical cells.

Meanwhile, as disclosed in WO98/15983 and WO99/10935, the inventor of the present invention have proposed a granular light-emitting or light-receiving semiconductor cell in which a diffusion layer, a pn junction, and a pair of electrodes are formed on a spherical semiconductor element composed of a p or n type semiconductor. Also, in WO98/15983, the inventor has proposed a semiconductor module in which numerous spherical semiconductor cells are connected in series, or a plurality of these serially connected cells are connected in parallel, and which can be used in a variety of light-emitting devices and color displays, photocatalytic devices used in the electrolysis of water and so forth, solar cells, and other such applications.

With this semiconductor module, if any of the semiconductor cells in any of the serially connected groups should malfunction and become open, current stops flowing to the serial circuit containing that semiconductor element, and the rest of the normally-operating semiconductor cells in that serially connected group also cease to function, so there is a drop in the output of the semiconductor module.

In view of this, the inventor hit upon a serial/parallel connection structure in which a plurality of semiconductor cell are laid out in a matrix, the various columns of semiconductor cells are connection serially, and the rows of semiconductor cells are connected in parallel, resulting in application for a number of international patent applications.

However, with the semiconductor module in WO98/15983, the structure that is employed involves connected the electrodes of the semiconductor cells together, and thereby connecting a plurality of semiconductor cells in series, and arranging these serially connected groups in a plurality of planar columns, so the pair of electrodes of the semiconductor cells is extremely small, and therefore when the above-mentioned serial/parallel connection structure is employed, manufacturing becomes more complicated, it is difficult to manufacture large semiconductor modules, and this drives up the cost of manufacturing semiconductor modules.

Specifically, when a semiconductor module is produced, a plurality of semiconductor cell of the first row are connected in parallel, over which a plurality of semiconductor cells of the next row are connected both serially and in parallel, and this procedure has to be repeated over and over to assemble the above-mentioned serial/parallel connection structure. Also, since there are no gaps between the serially connected cells, another problem is that surrounding reflected and scattered light may have difficulty getting in.

It is an object of the present invention to provide a light-emitting or light-receiving semiconductor module in which a plurality of granular semiconductor cells are connected with a serial/parallel connection structure. It is another object of the present invention to provide a light-emitting or light-receiving semiconductor module comprising a cell layout that facilitates the utilization of reflected and scattered light between cells. It is a further object of the present invention to provide a light-emitting or light-receiving semiconductor module comprising a serial/parallel connection structure which can be manufactured by a simple manufacturing process. It is yet another object of the present invention to provide a method for manufacturing a light-emitting or light-receiving semiconductor module with which manufacturing costs can be lowered.

DISCLOSURE OF THE INVENTION

The light-emitting or light-receiving semiconductor module pertaining to the present invention comprises a pair of sheets including a first sheet made of a translucent insulating material and a second sheet made of an insulating material and disposed parallel to this first sheet, and a plurality of granular semiconductor cells disposed in a plurality of rows and a plurality of columns in between these sheets.

Each of the semiconductor cells comprises a p or n type semiconductor granule, a pn junction formed at the top layer of the semiconductor granule, and a pair of electrodes formed at either end of the semiconductor granule and connected to the ends of the pn junction, and has a light-emitting or light receiving function, and each semiconductor cell is disposed in a state such that the conduction direction linking the pair of electrodes is perpendicular to the pair of sheets. A plurality of granular semiconductor cells are grouped into a plurality of groups each of which includes a plurality of semiconductor cells having a common conduction direction. A parallel connection mechanism for the parallel connection of a plurality of semiconductor cells of each group, and a serial connection mechanism for the serial connection of the semiconductor cells of each group with the semiconductor cells of adjacent groups are provided to the opposing inner surfaces of the pair of sheets.

Here, it is also possible to employ the following constitutions.

(1) Each of the semiconductor cells has a light-receiving function involving opto-electric conversion.

(2) Each of the semiconductor cells has a light-emitting function involving electro-optical conversion.

(3) The granular semiconductor cells are spherical semiconductor cells.

(4) The granular semiconductor cells are cylindrical semiconductor cells.

(5) The second sheet is composed of a translucent sheet.

(6) The first sheet is composed of a glass sheet, and numerous fine pyramid cuts or bumps are formed on the outer surface of this glass sheet.

(7) The pair of sheets is composed of flexible sheets made of a synthetic resin.

(8) An insulating, transparent synthetic resin is packed into the space between the plurality of semiconductor cells in between the pair of sheets.

(9) The parallel connection mechanism comprises a first conductive film formed on the inner surface of each of the first and second sheets, and the serial connection mechanism comprises a second conductive film formed on the inner surface of each of the first and second sheets.

(10) In (9), the first and second conductive films on the inner surface of the first sheet are composed of a transparent metal oxide conductive film.

(11) In (10), the first and second conductive films on the inner surface of the second sheet are composed of a transparent metal oxide conductive film.

(12) In (10), the first and second conductive films on the inner surface of the second sheet are composed of metal conductive films that function as light reflecting films.

(13) In (9), the first and second conductive films on the inner surface of the first sheet are composed of printed wiring.

(14) In (13), the first and second conductive films on the inner surface of the second sheet are composed of printed wiring.

(15) In (13), the first and second conductive films on the inner surface of the second sheet are composed of metal conductive films that function as light reflecting films.

(16) The second sheet is constituted by a translucent sheet, and [the module] is structured so as to be capable of receiving external light incident from the front side and back side of the pair of sheets.

(17) In (16), a specific gap is provided between the semiconductor cells, and [the module] is structured so that part of the back side of the pair of sheets can be seen through the front side, or part of the front side can be seen through the back side.

(18) In (2), the second sheet is constituted by a translucent sheet, and [the module] is structured so that light can radiate from the front side of the pair of sheets to the back side.

The method for manufacturing a light-emitting or light-receiving semiconductor module according to the present invention comprises:

a first step of readying a first sheet made of a translucent insulating material and a second sheet made of an insulating material and capable of facing parallel to this first sheet, and a plurality of semiconductor cells having a light-emitting or light-receiving function and comprising a pair of electrodes;

a second step of forming respectively a plurality of conductive films on the inner surface of each of the first and second sheets;

a third step of bonding one of the electrodes of the plurality of semiconductor cells to one portion of each conductive film of the first sheet, and bonding the same electrode of the plurality of semiconductor cells as the one mentioned above to one portion of each conductive film of the second sheet; and a fourth step of bringing the first and second sheets closer together and across from each other, bonding the other electrode of the plurality of semiconductor cells bonded to each conductive film of the first sheet to the corresponding conductive film of the second sheet, and bonding the other electrode of the plurality of semiconductor cells affixed to each conductive film of the second sheet to the corresponding conductive film of the first sheet.

Another method for manufacturing a light-emitting or light-receiving semiconductor module pertaining to the present invention comprises:

a first step of readying a first sheet made of a translucent insulating material and a second sheet made of an insulating material and capable of facing parallel to this first sheet, and a plurality of semiconductor cells having a light-emitting or light-receiving function and comprising a pair of electrodes;

a second step of forming respectively a plurality of conductive films on the inner surface of each of the first and second sheets;

a third step of bonding one of the electrodes of the plurality of semiconductor cells to each conductive film of the second sheet; and a fourth step of bringing the first and second sheets closer together and across from each other and bonding the other electrode of the plurality of semiconductor cells, which is bonded on the second sheet side, to the corresponding conductive film of the first sheet.

In the fourth step here, the groups of a plurality of semiconductor cells connected in parallel in this fourth step may be serially connected to adjacent groups.

BRIEF DESCRIPTION OF THE DRAWINGS

FIG. 10 is a rear view of the first sheet of the solar module pertaining to

Figure 11:
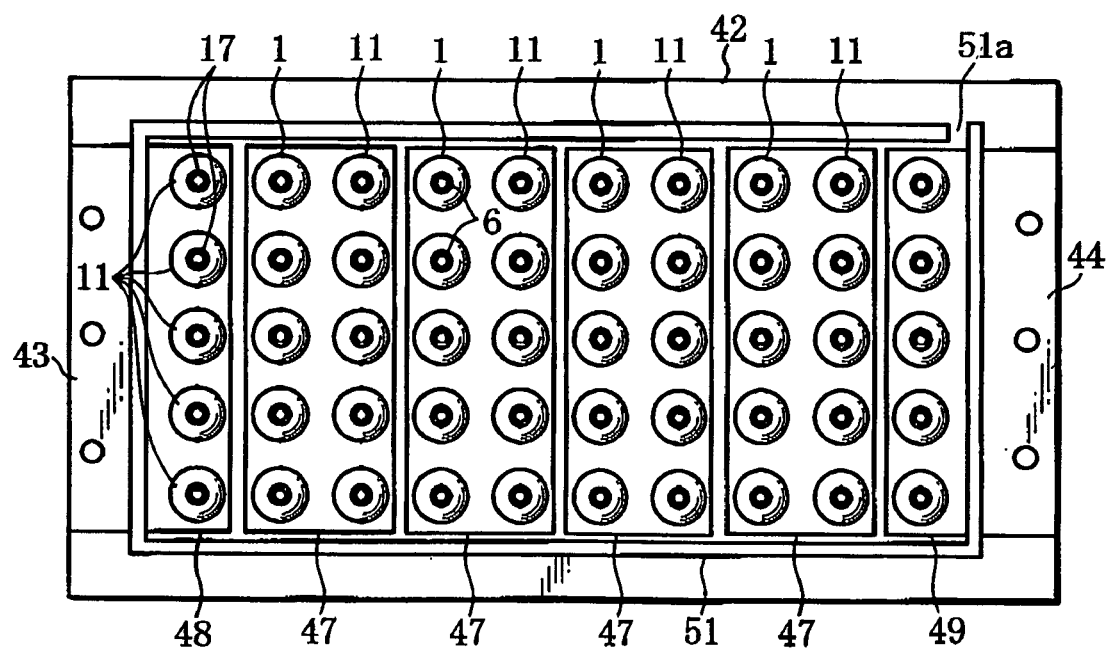
Figure 12:
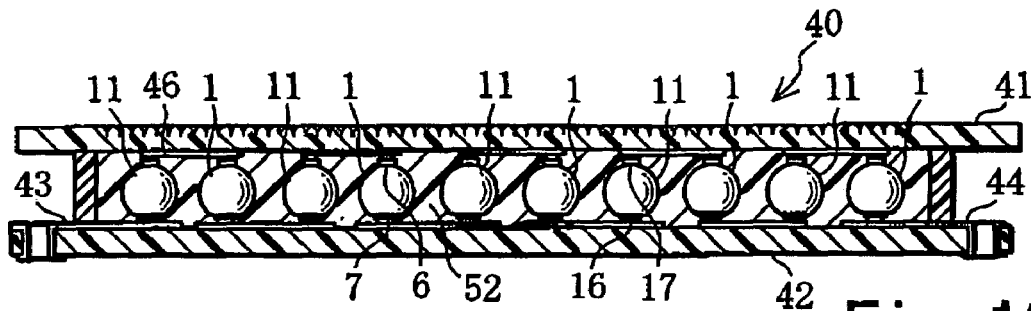
Figure 13:
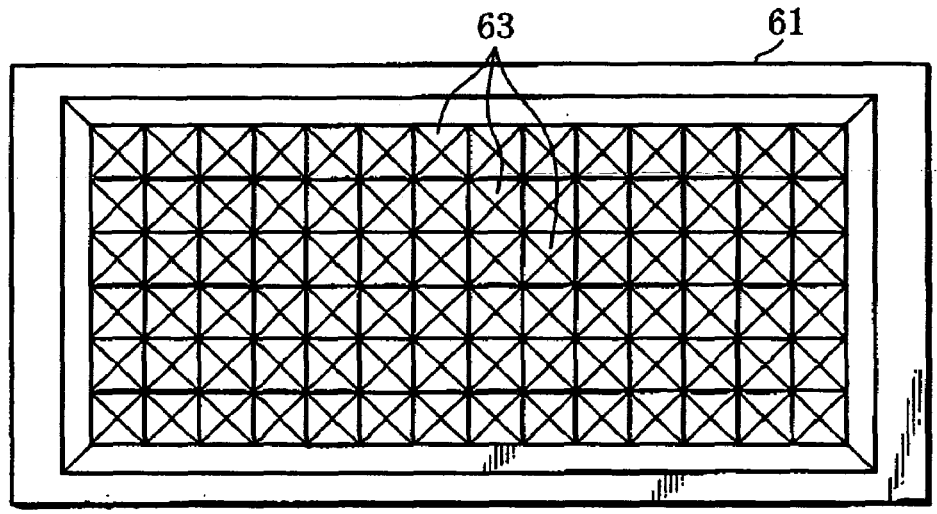

Modification 1;

FIG. 11 is a plan view of the second sheet;

FIG. 12 is a cross section al view of the solar module;

FIG. 13 is a plan view of the first sheet of the solar module pertaining to

Figure 14:
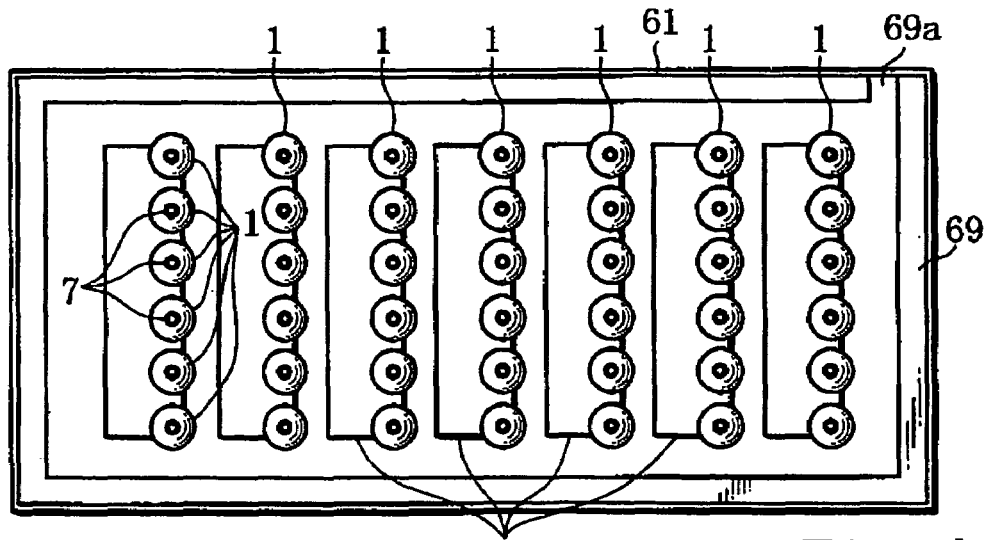
Figure 15:
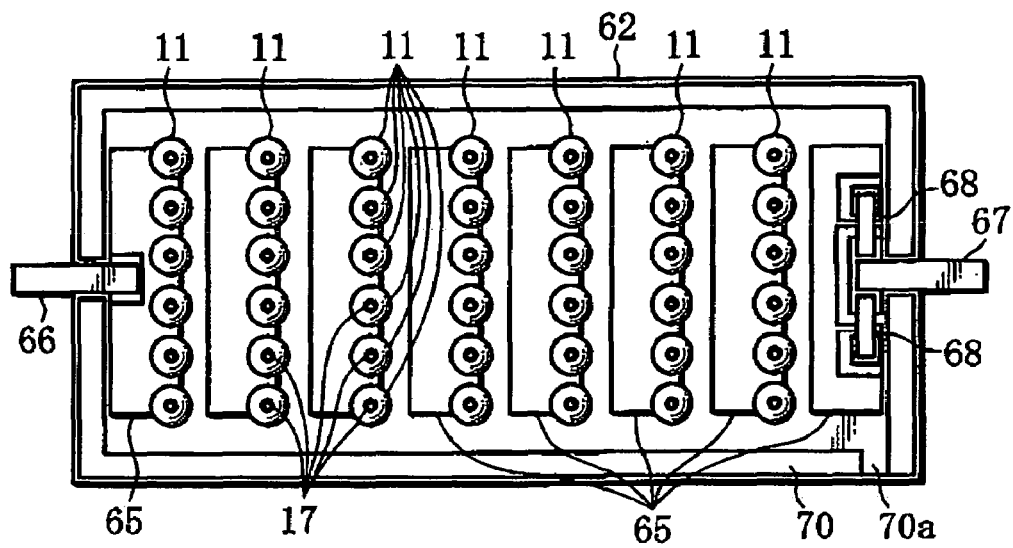
Figure 16:
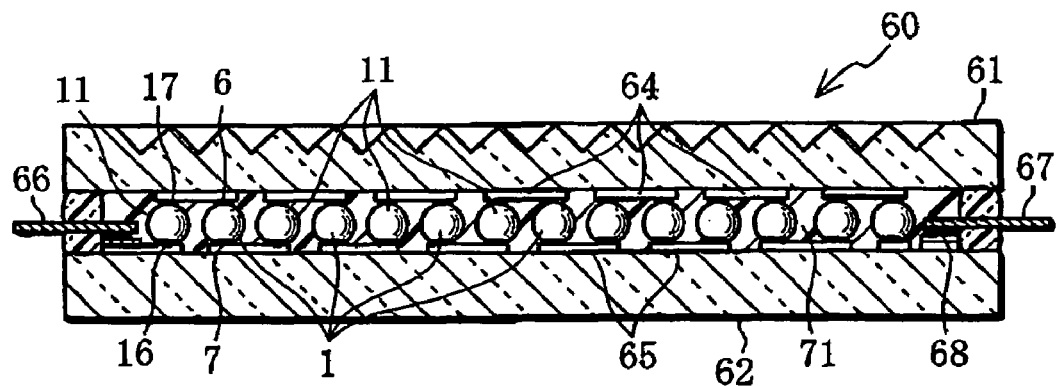
Figure 17:
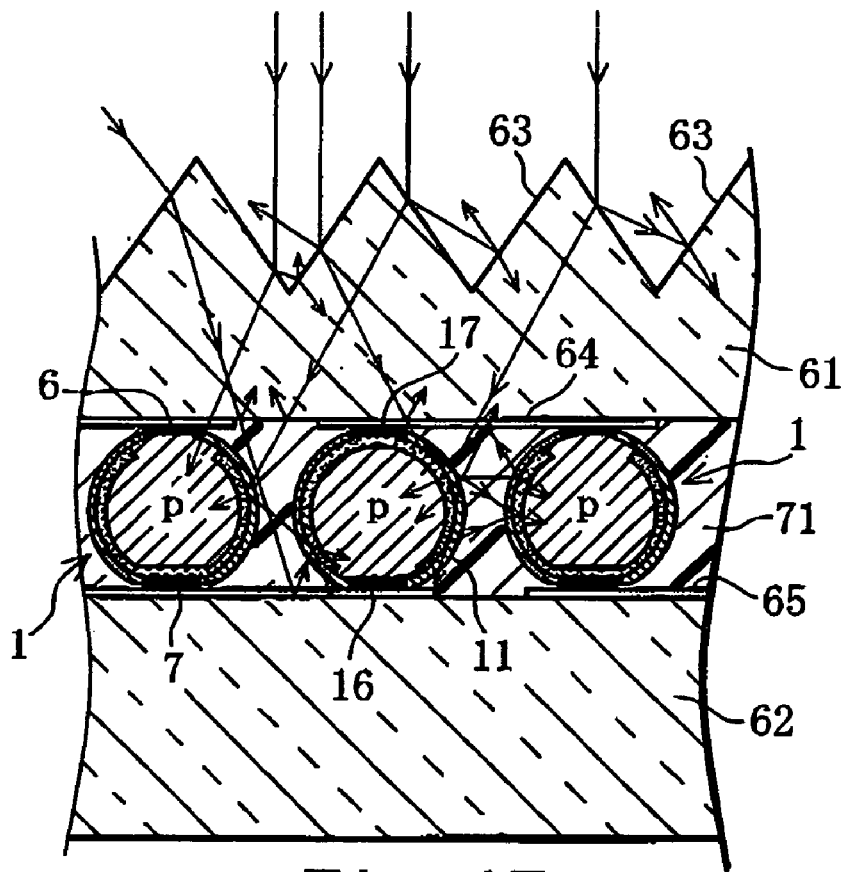
Figure 18:
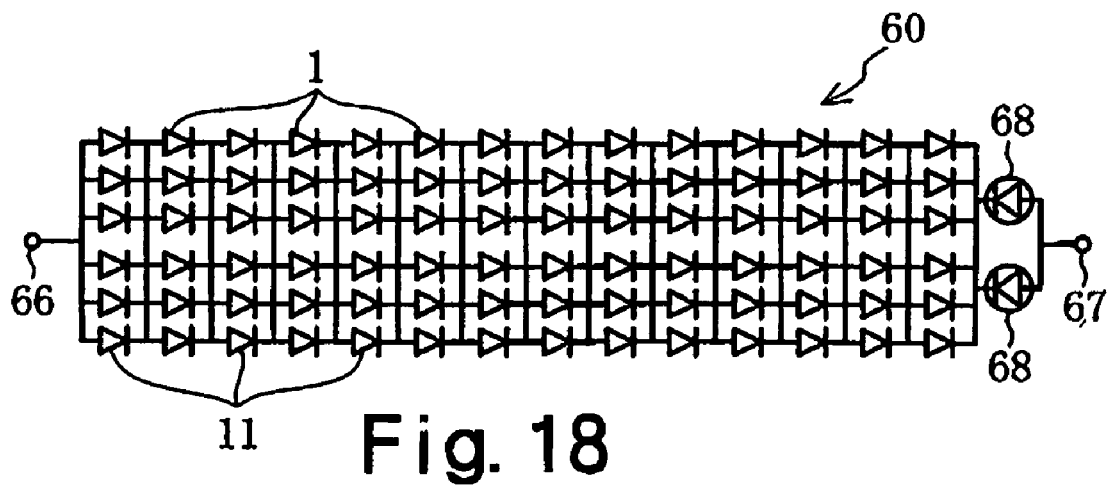
Figure 19:
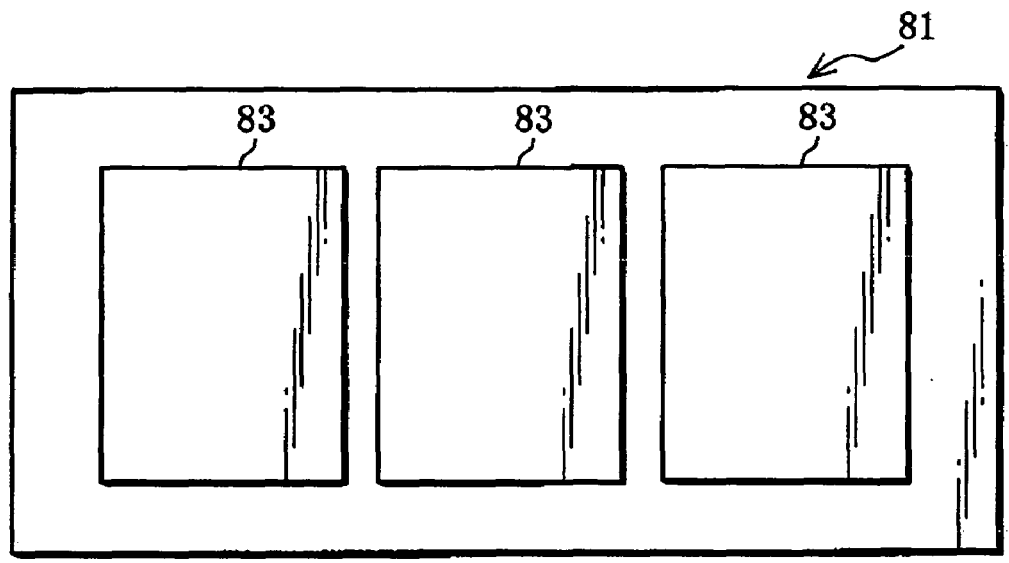

Modification 2;

FIG. 14 is a rear view of the first sheet;

FIG. 15 is a plan view of the second sheet;

FIG. 16 is a cross section al view of the solar module;

FIG. 17 is a detail cross section al view of the solar module;

FIG. 18 is an equivalent circuit diagram of the solar module;

FIG. 19 is a rear view of the first sheet of the solar module pertaining to

Figure 20:
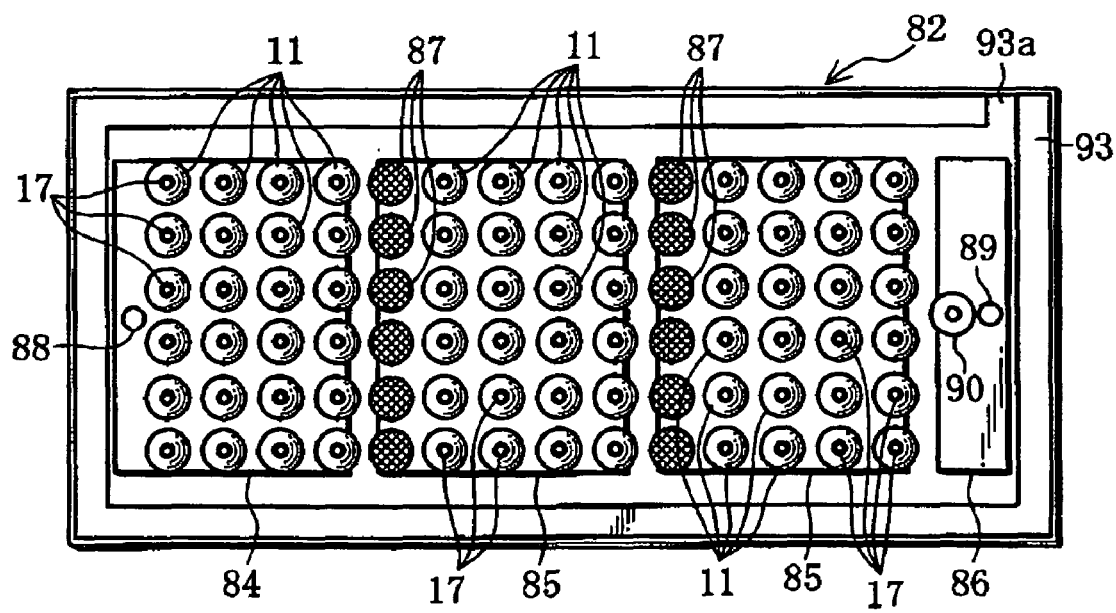
Figure 21:
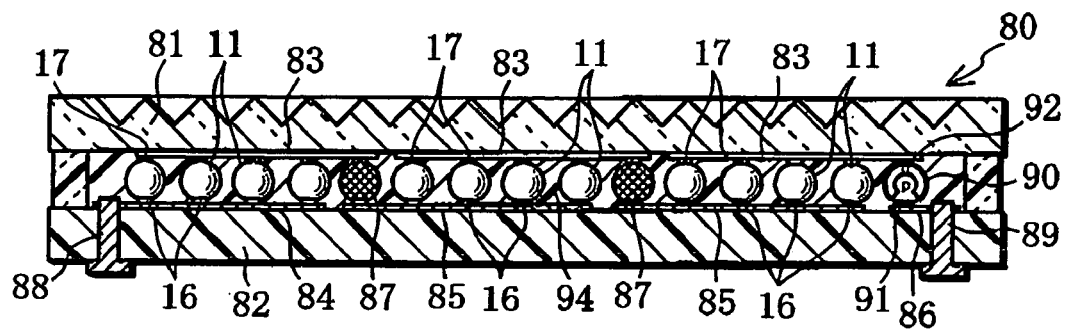
Figure 22:
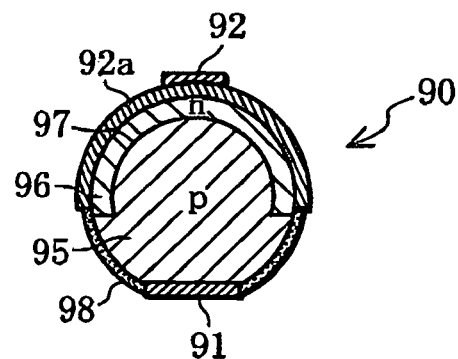
Figure 23:
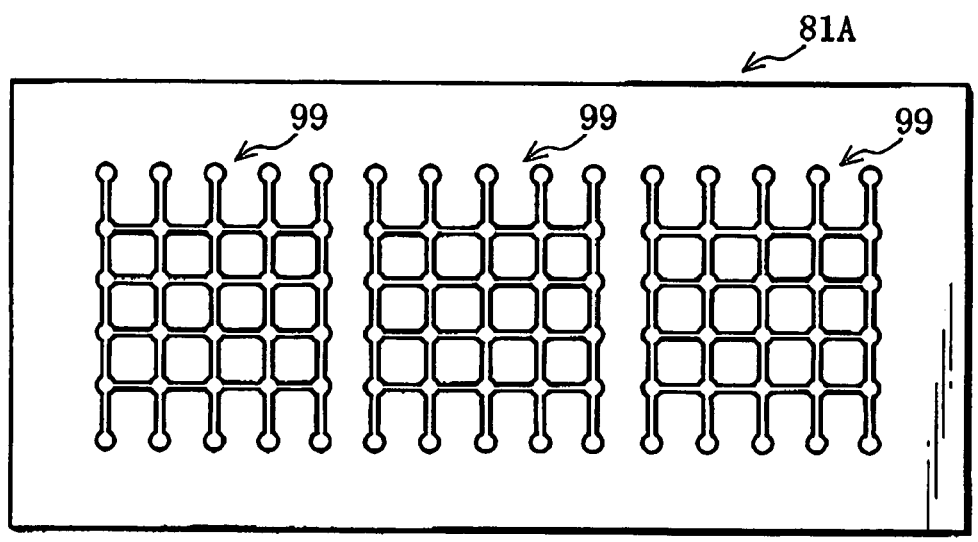
Figure 24:
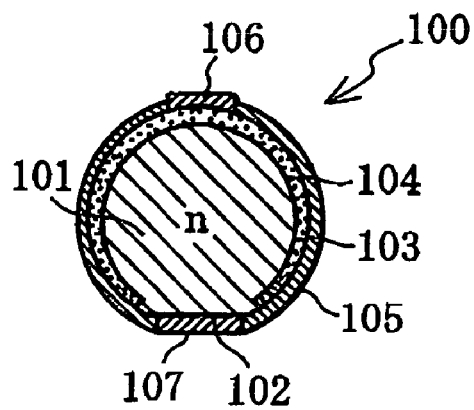
Figure 25:
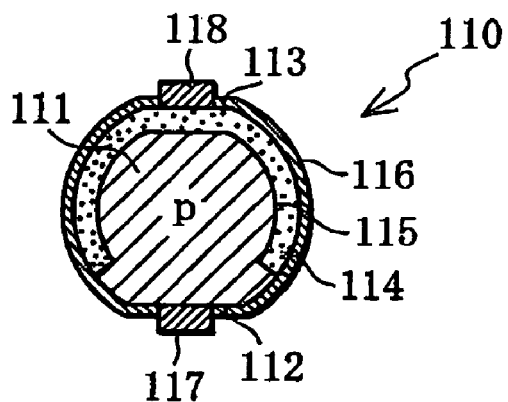

Modification 3;

FIG. 20 is a plan view of the second sheet;

FIG. 21 is a cross section al view of the solar module;

FIG. 22 is a cross section al view of a spherical diode;

FIG. 23 is a rear view of a modified first sheet;

FIG. 24 is a cross section al view of another spherical solar cell;

FIG. 25 is a cross section al view of another spherical solar cell; and

Figure 26:
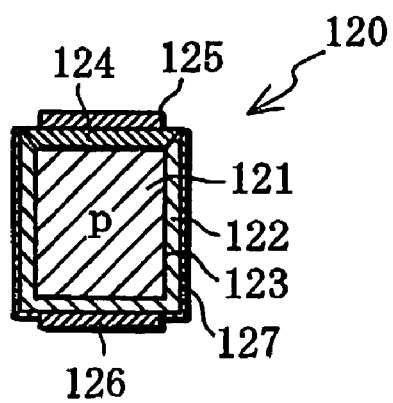

FIG. 26 is a cross section al view of a cylindrical solar cell.

PREFERRED EMBODIMENT OF THE INVENTION

Embodiments of the present invention will now be described through reference to the drawings.

Figure 1:
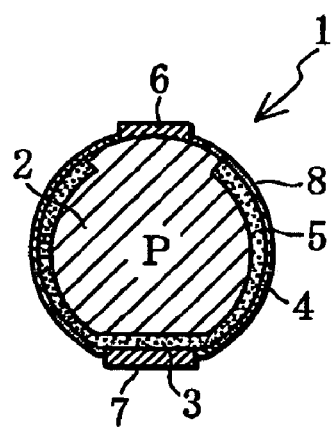
FIG. 1 is a cross section al view of a spherical solar cell.
Figure 2:
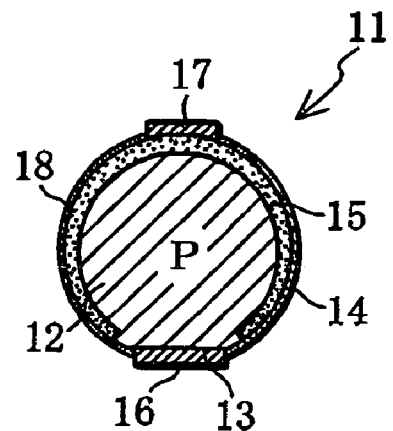
FIG. 2 is another cross section al view of a spherical solar cell.

FIGS. 1 and 2 illustrate spherical solar cells 1 and 11 as [examples of] a granular light-receiving semiconductor cell. The spherical solar cell 1 shown in FIG. 1 has formed as element a spherical crystal 2 with a diameter of approximately 0.6 to 2.0 mm and composed of a p type silicon monocrystal with a resistivity of about 1 m. A flat surface 3 with a diameter of approximately 0.6 mm is formed at the lower end of this spherical crystal 2, and an n+ type diffusion layer 4 (thickness of approximately 0.4 to 0.5 μm) comprising phosphorus (P) diffused at the surface portion of this spherical crystal 2, and a pn junction 5 are also formed. The 0.6 mm diameter of the flat surface 3 is the size used when the spherical crystal 2 has a diameter of 2.0 mm.

A pair of electrodes 6, 7 (positive electrode 6 and negative electrode 7) are provided at the two ends of the spherical crystal 2, and the negative electrode 7 is disposed at the flat surface 3. The positive electrode 6 is connected to the spherical crystal 2, while the negative electrode 7 is connected to the n+ type diffusion layer 4. An antireflective film 8 (thickness of approximately 0.6 to 0.7 μm) composed of an insulating film of SiO2 or TiO2 is formed over the entire surface except for the positive electrode 6 and the negative electrode 7. The positive electrode 6 is formed by baking an aluminum paste, while the negative electrode 7 is formed by baking a silver paste, for example.

This spherical solar cell 1 can be produced by first producing the spherical crystal 2 by the method proposed by the inventor in WO98/15983, and then forming the flat surface 3, the n+ type diffusion layer 4, the pair of electrodes 6, 7, and the antireflective film 8. The spherical crystals 2 are produced by employing a drop tube with a height of approximately 14 m. Granules of p type silicon (the raw material) were heated and melted inside at the top of the drop tube, then allowed to fall freely and solidify while a true spherical shape was maintained through the surface tension, which produced spherical crystals 2 of substantially true spherical shape. The spherical crystals 2 need not be produced with a drop tube, and a process such as mechanical polishing may instead be used to form spherical or substantially spherical crystals.

The flat surface 3 can be formed by mechanically polishing part of the spherical crystal 2. The formation of this flat surface 3 makes the spherical crystal 2 less apt to roll, allows lifting with a vacuum wand, and makes it possible to differentiate between the positive electrode 6 and the negative electrode 7. Next, when the n+ type diffusion layer 4 is formed, phosphorus (P) is diffused on the surface of the spherical crystal 2 as an n type impurity by a known method or a method disclosed in one of the above-mentioned publications, with part of the top of the spherical crystal 2 masked. The pair of electrodes 6, 7 and the antireflective film 8 can also be formed by a known method or a method disclosed in one of the above-mentioned publications. This spherical solar cell 1 has an opto-electric conversion function, and generates a photoelectromotive force of 0.5 to 0.6 V upon exposure to sunlight.

The spherical solar cell 11 shown in FIG. 2 is constituted such that the positions of the n+ type diffusion layer 14 and the pair of electrodes 16, 17 are reversed from those in the spherical solar cell 1 shown in FIG. 1, but has substantially the same structure. This spherical solar cell 11 comprises a spherical crystal 12 composed of a p type silicon monocrystal, a flat surface 13, an n+ type diffusion layer 14, a pn junction 15, a pair of electrodes 16, 17 composed of a positive electrode 16 and a negative electrode 17, and an antireflective film 18. These are the same as the spherical crystal 2, flat surface 3, n+ type diffusion layer 4, pn junction 5, pair of electrodes 6 and 7, and antireflective film 8 in the spherical solar cell 1 described above, and can be produced or formed similarly.

Next, a panel-form solar module can be constituted as a semiconductor module using either or both of the above two types of spherical solar cells 1 and 11. The structure of and method for manufacturing the solar module 20 employing the spherical solar cell 11 in a first embodiment will be described based on FIGS. 3 to 9.

First, the basics of the solar module 20 will be described.

The solar module 20 is constituted such that numerous spherical solar cells 11 are incorporated in a matrix of numerous rows and columns between a pair of sheets 21, 22. If we assume that the size of this solar module 20 is 10 cm wide and 20 cm long, and the spherical solar cells 11 are laid out at a pitch of 4 mm, then the spherical solar cells 11 are disposed in a matrix of 25 rows and 50 columns, for instance. Since such a fine structure is difficult to depict, in this embodiment just a detail view will be given for the sake of facilitating understanding, using as an example a case in which 50 spherical solar cells 11 are laid out in 5 rows and 10 columns.

Figure 7:
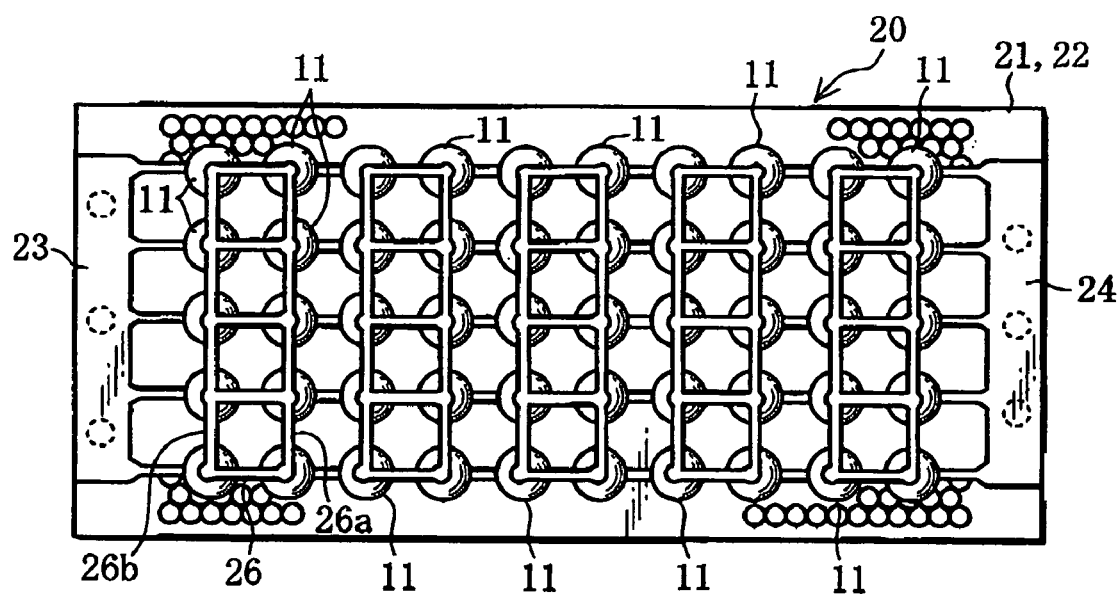
FIG. 7 is a plan view of the solar module.
Figure 8:
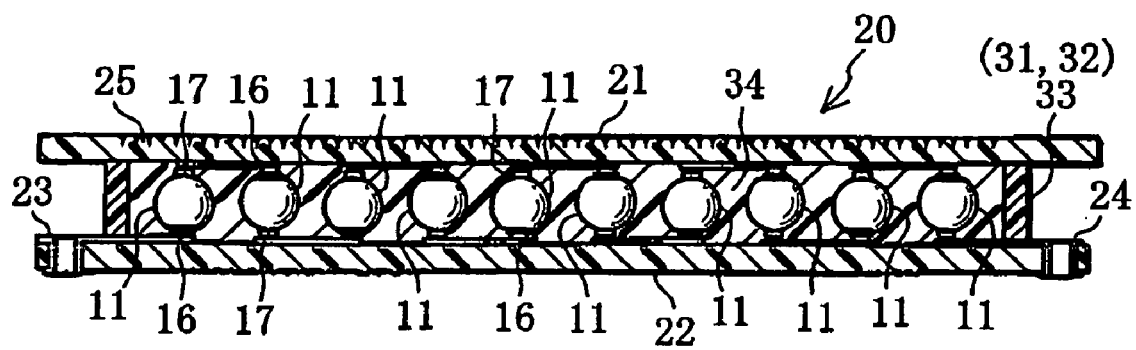
FIG. 8 is a cross section al view of the solar module.

As shown in FIGS. 7 and 8, the solar module 20 comprises a pair of sheets including a first sheet 21 made of a translucent insulating material and a second sheet 22 made of an insulating material and disposed parallel to this first sheet 21, and 50 of the spherical solar cells 11 laid out in 5 rows and 10 columns between these sheets 21, 22. A positive electrode terminal 23 and a negative electrode terminal 24 are provided at the left and right ends, respectively, of the second sheet 22.

Figure 5:
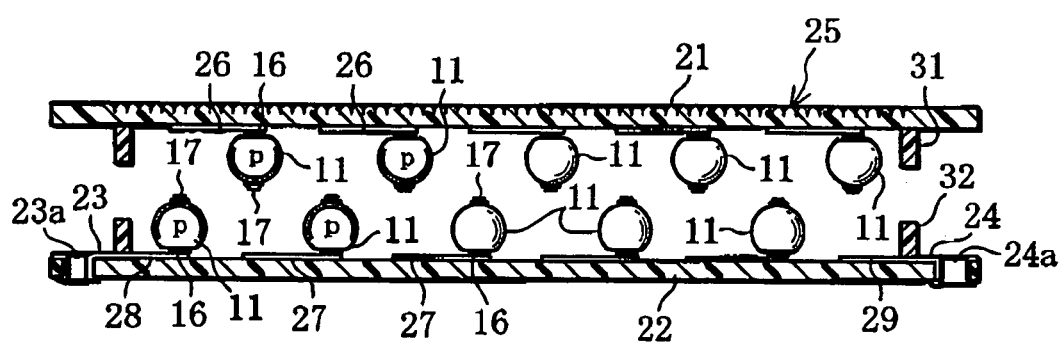
FIG. 5 is a cross section al view illustrating the state midway through the assembly of the first and second sheets.
Figure 6:
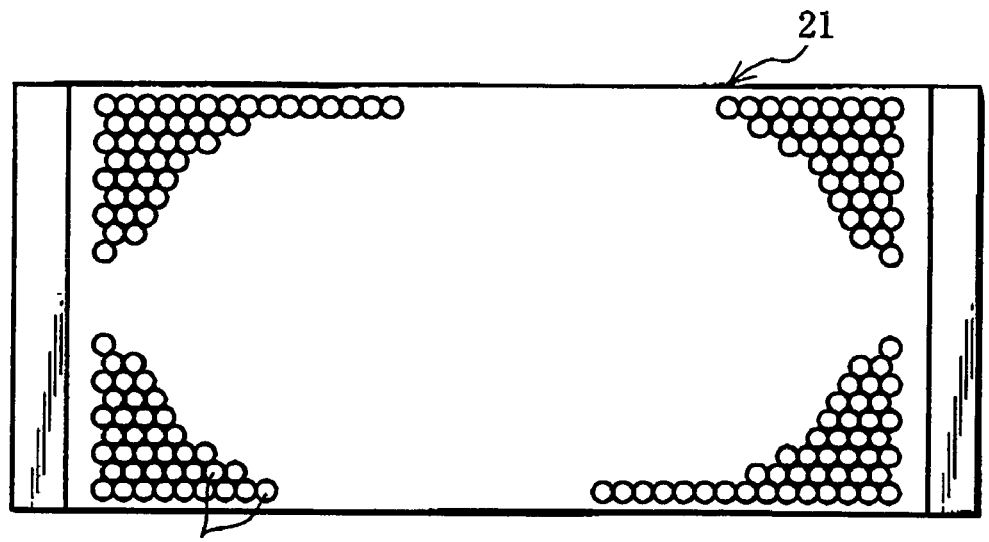
FIG. 6 is a plan view of the first sheet.

The spherical solar cells 11 are laid out such that the conduction direction linking the pair of electrodes 16, 17 is perpendicular to the pair of sheets 21, 22. As shown in FIG. 5, the five spherical solar cells 11 in each column bonded to the first sheet 21 are disposed with the positive electrodes 16 facing up and the negative electrodes 17 facing down, and the five spherical solar cells 11 in each column bonded to the second sheet 22 are disposed with the positive electrodes 16 facing down and the negative electrodes 17 facing up. A parallel connection mechanism for the parallel connection of the five spherical solar cells 11 of each group, and a serial connection mechanism for the serial connection of the spherical solar cells 11 of each group with the spherical solar cells 11 of adjacent groups are provided to the opposing inner surfaces of the pair of sheets 21 and 22.

Next, the method for manufacturing the solar module 20 and the detailed structure thereof will be described.

First, the first and second sheets 21, 22, and 50 of the spherical solar cells 11 are readied.

The first and second sheets 21, 22 are transparent, flexible printed substrates with a thickness of 0.1 to 0.5 mm, and are made of a transparent electrically-insulating synthetic resin material (such as polycarbonate, acrylic, polyacrylate, methacrylic, silicone, or polyester). Numerous rows and columns of small dome-shaped protrusions 25 (these correspond to the bumps) are formed on the outside (top) of the first sheet 21 in order to reduce reflection loss of light incident on the solar module 20. These numerous rows and columns of protrusions 25 can be formed during the roll formation of the first sheet 21.

Figure 3:
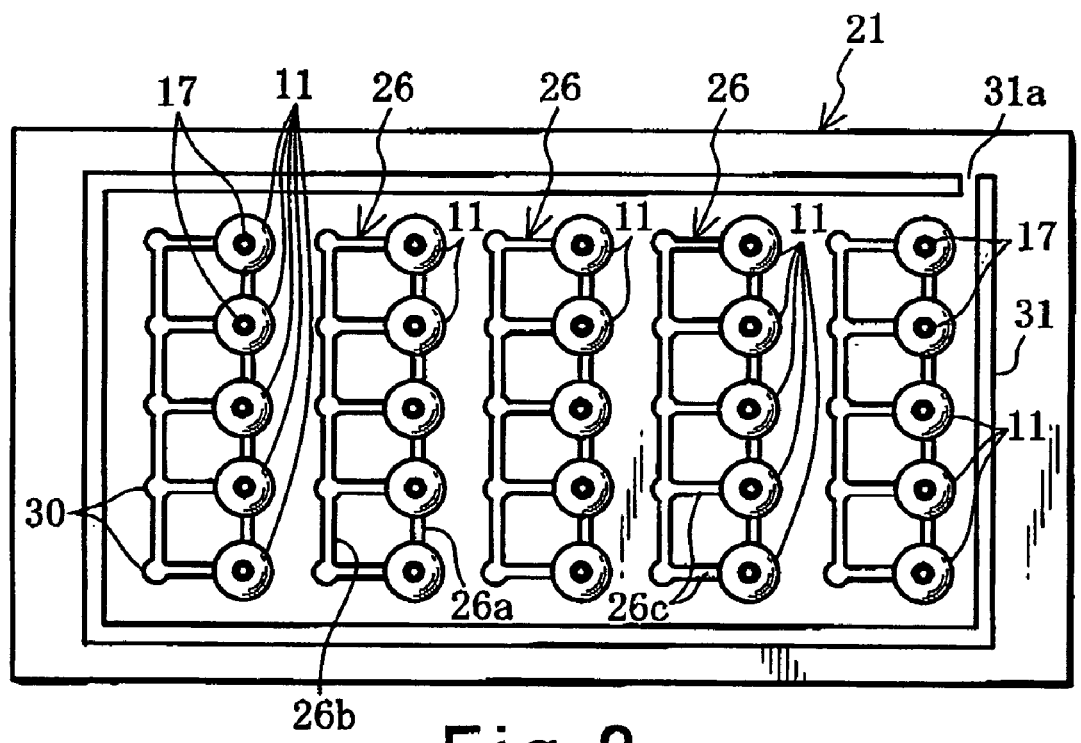
FIG. 3 is a rear view of a first sheet of a solar module.

FIG. 3 illustrates the first sheet 21 turned upside-down. As shown in this FIG. 3, five sets of ladder-like conduction paths 26 (conductive films) are formed on the inner (lower) surface of the first sheet 21, and as a shown in FIG. 4, four sets of ladder-like conduction paths 27 (conductive films) and two sets of half-ladder-like conduction paths 28, 29 (conductive films) are formed on the inner (upper) surface of the second sheet 22. Wiring is formed on the inner surface of the first sheet 21 by applying copper foil, masking the conduction paths 26, and etching, and the conduction paths 26 are formed by silver-plating the surface of this printed wiring. Similarly, wiring is formed on the inner surface of the second sheet 22 by applying copper foil, masking the conduction paths 27 to 29, and etching, and the conduction paths 27 to 29 are formed by silver-plating the surface of this printed wiring.

The second sheet 22 includes a positive electrode terminal 23 connected to the half-ladder-like conduction path 28 at the left end of the sheet, and a negative electrode terminal 24 connected to the half-ladder-like conduction path 29 at the right end. Through-holes 23a, 24a for electrically connecting the solar module 20 to another solar module or to electrical wiring are formed in the positive electrode terminal 23 and the negative electrode terminal 24. In the formation of the conduction paths 26 to 29, substantially circular pads 30 are formed at the intersections along the conduction paths 26 to 29 where the positive and negative electrodes 16, 17 of the spherical solar cell 11 are joined.

Next, as shown in FIG. 3, with the inner surface of the first sheet 21 facing upward, the positive electrodes 16 of the five spherical solar cells 11 in each column are coated with a conductive adhesive such as a conductive epoxy resin, and are bonded to the five pads 30 of one parallel connection component 26a of the conduction path 26 of each set. After the adhesive has been cured, the negative electrodes 17 of the five spherical solar cells 11 of each column are coated with a conductive adhesive.

Figure 4:
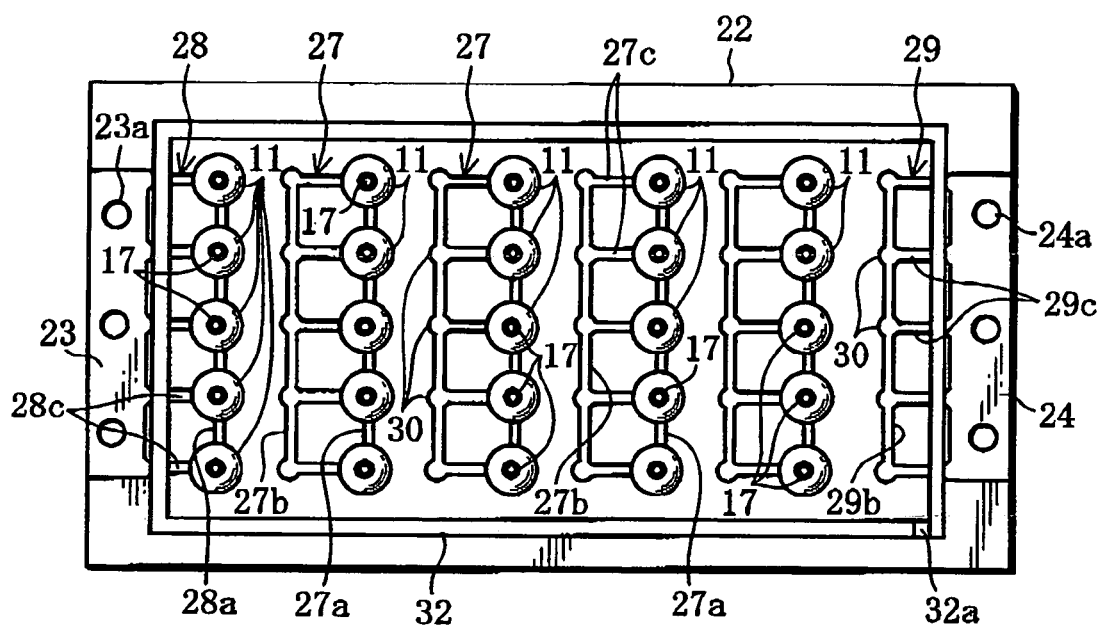
FIG. 4 is a plan view of a second sheet of the solar module.

Similarly, as shown in FIG. 4, with the inner surface of the second sheet 22 facing upward, the positive electrodes 16 of the five spherical solar cells 11 in each column are coated with a conductive adhesive and bonded to the five pads 30 of one parallel connection component 27a of the conduction path 27 of each set, and to the five pads 30 of one parallel connection component 28a of the conduction path 28 on the left end. After the adhesive has been cured, the negative electrodes 17 of the five spherical solar cells 11 of each column are coated with a conductive adhesive.

Next, as shown in FIG. 3, a sealant 31 composed of butyl rubber is applied around the outer periphery of the inner surface of the first sheet 21, forming a single opening 31a. Similarly, as shown in FIG. 4, a sealant 32 composed of butyl rubber is applied around the outer periphery of the inner surface of the second sheet 22 so as to face the sealant 31, forming a single opening 32a corresponding to the above-mentioned opening 31a.

Next, as shown in FIG. 5, with the first sheet 21 reversed from its orientation in FIG. 3, the first sheet 21 is placed above the second sheet 22, the five columns of spherical solar cells 11 of the first sheet 21 are faced to and aligned with the five parallel connection components 27b and 29b of the second sheet 22, then the first and second sheets 21, 22 are brought together so as to bond the negative electrodes 17 of the spherical solar cells 11 of each column of the first sheet 21 to the corresponding parallel connection components 27b and 29b of the second sheet 22, and bond the negative electrodes 17 of the spherical solar cells 11 of each column of the second sheet 22 to the corresponding parallel connection components 26b of the first sheet 21. Here, the sealant 31 and the sealant 32 are joined, heated, and cured to form a rectangular sealant wall 33. After this, the space on the inside of the sealant wall 33 between the first and second sheets 21 and 22 is filled with an insulating transparent liquid (a filler whose main component is a methacrylic resin or silicone resin) by injection through injection holes formed by the openings 31a, 32a. The liquid is cured into a flexible filler 34 by heating or irradiation with ultraviolet light, which completes the solar module 20.

It is also possible for the formation of the conduction paths 26 on the first sheet 21 or the bonding of the spherical solar cells 11 to be carried out while the first sheet 21 is moving along a conveyor line with its inner surface facing downward, so it is possible for the solar module 20 to be assembled on an automated line that includes various kinds of apparatus or mechanism. Also, the conduction paths 26 to 29 may be made from transparent, conductive synthetic resin films.

With the solar module 20 structured as above, the five spherical solar cells 11 in each column (the spherical solar cells of each group) are connected in parallel by upper and lower parallel connection components 26a, 27a, 28a, 26b, 27b, and 29b. As shown in FIG. 3, the parallel connection components 26a, 26b of each set of the conduction paths 26 of the first sheet 21 are connected in series by a serial connection component 26c. Similarly, as shown in FIG. 4, the parallel connection components 27a, 27b of each set of the conduction paths 27 of the second sheet 22 are connected in series by the serial connection components 27c, the parallel connection components 28a on the left end are connected in series to the positive electrode terminal 23 by the serial connection components 28c, and the parallel connection components 29b on the right end are connected in series to the negative electrode terminal 24 by the serial connection components 29c. In this way, the spherical solar cells 11 of each column (the spherical solar cells of each group) are serially connected to the spherical solar cells 11 of adjacent columns (groups) via the serial connection components 26c to 29c, and the positive electrode terminal 23 and negative electrode terminal 24 are connected to the two ends thereof. In other words, the upper and lower parallel connection components 26a, 27a, 28a, 26b, 27b, and 29b correspond to parallel connection mechanisms and to a first conductive film, while the serial connection components 26c to 29c correspond to a serial connection mechanism and to a second conductive film.

Figure 9:
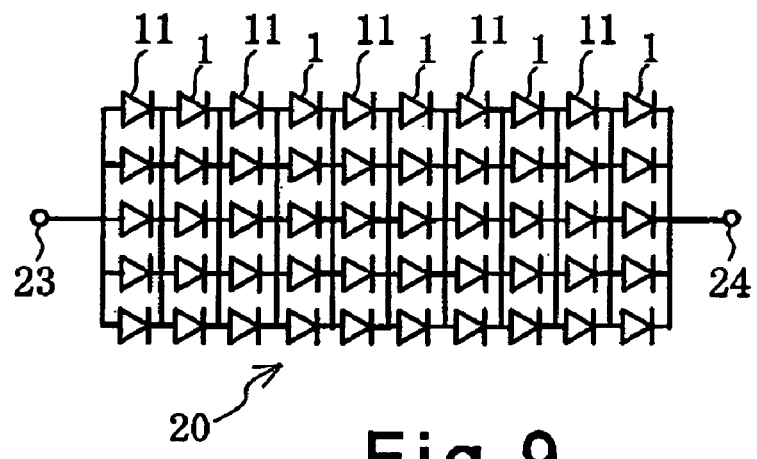
FIG. 9 is an equivalent circuit diagram of the solar module.

FIG. 9 shows an equivalent circuit of this solar module 20. When the photoelectromotive force of one spherical solar cell 11 is 0.6 V, for instance, a photoelectromotive force of 6.0 V is generated between the positive electrode terminal 23 and the negative electrode terminal 24. If we let I be the current generated by the ten spherical solar cells 11 in each row, then a current of 5I is outputted from the positive electrode terminal 23 to an external load.

With this solar module 20, since the five spherical solar cells 11 in each column (each group) are connected in parallel, and the five spherical solar cells 11 in each column are connected in series to the five spherical solar cells 11 in an adjacent column, even if any of the spherical solar cells 11 should cease functioning due to a malfunction or suffer diminished function due to being in the shade, all that will happen is that the photoelectromotive force produced by these spherical solar cells 11 will decrease or cease altogether, but since the output of the normally-operating spherical solar cells 11 shunted through the other spherical solar cells in a parallel connection relationship, this output is hardly affected at all by a malfunction or diminished function of some of the spherical solar cells, resulting in a solar module 20 with excellent reliability and durability.

With this solar module 20, the first sheet 21 is usually disposed facing the side where the light is incident, and since numerous fine protrusions 25 are formed on the surface of the first sheet 21, even if incoming light is incident at a very shallow angle, refraction and scattered reflection at the surface of the numerous protrusions 25 will be repeated over and over while the light is guided in, and the light will be incident from various directions on the spherical solar cells 11. Since the surface of each spherical solar cell 11 is spherical, light coming in from a variety of directions is introduced very well, so a high optical utilization factor is maintained in the solar module 20. Furthermore, since the spherical solar cells 11 are spherical, the direction in which incident light can be absorbed is not limited to a narrow range, and instead light coming in from many different directions can be absorbed, and a high optical utilization factor is maintained.

Since the second sheet 22 is made of a transparent material, photoelectromotive force is also generated by light coming in through the second sheet 22 from the back side. However, if no light is incident on the back side of the second sheet 22, a reflective film that reflects light incident from the first sheet 21 may be applied to the back of the second sheet 22.

With this solar module 20, a specific gap is provided between the spherical solar cells 11, and the first and second sheets 21, 22 are made of a transparent material that affords natural lighting, so the solar module 20 can be used as window glass or applied to window glass. If no natural lighting is necessary, though, the pitch at which the spherical solar cells 11 are disposed may be reduced so as to raise the power generation performance.

Because this solar module 20 has a flexible structure that is lightweight and extremely thin (a thickness of approximately 1.0 to 3.0 mm), it has a wide range of applications, and can be applied to the curved surfaces of a variety of objects and to building roofs, fences, and walls. For instance, a power generating solar module can be applied to the surface of an automobile body, or can be embedded in automobile window glass. It is also possible to obtain a module that can be applied to power supplies for mobile devices incorporated into clothing. Another option is a module that can be stowed and deployed, as with one that is wound up. In the case of a curved module, it is also possible to expand optical directionality.

Because this solar module 20 contains so few parts and is so thin and light in weight, it is compact and can be manufactured on a relatively simple automated line, and less waste is generated.

Also, because the spherical solar cells 11 can be directly bonded to the conduction paths 26 to 29 of the first and second sheets 21 and 22, there is greater degree of freedom in the design of the wiring and layout of the spherical solar cells 11, the number of cells can be selected as needed, and the product can be designed to better match the application, such as a small output module, high voltage module, or high output module. Because this solar module 20 is equipped with the positive electrode terminal 23 and the negative electrode terminal 24, many standard solar modules 20 can be produced and connected serially, in parallel, or in a serial/parallel configuration, which allows the product to be expanded as dictated by the intended application. Also, if this solar module 20 is constituted such that a specific gap is left between the spherical solar cells 11, the result will be a translucent module compatible with natural lighting requirements, so this module can be applied to window glass. In addition, this solar module 20 can be configured in a variety of shapes.

Various modifications in which the above embodiment is partially modified will now be described.

Figure 10:
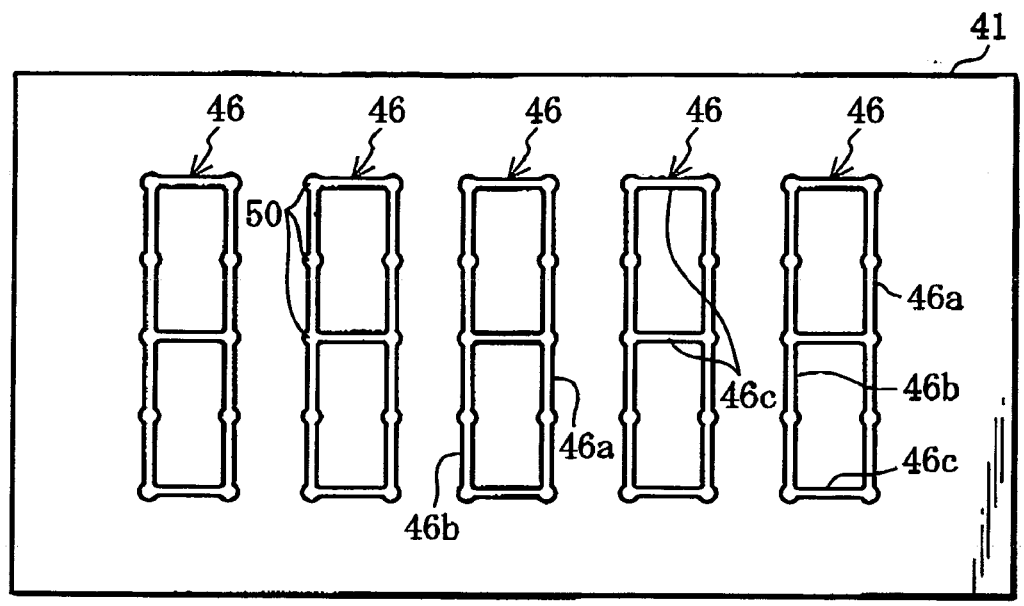

Modification 1 (see FIGS. 10 to 12)

This solar module 40 comprises first and second sheets 41, 42, five rows and ten columns of spherical solar cells 1 and 11 incorporated in between these sheets 41, 42, a parallel connection mechanism for the parallel connection of the five spherical solar cells 1 and 11 in each column (the spherical solar cells in each group), a serial connection mechanism for the serial connection of the spherical solar cells 1 and 11 in each column with the spherical solar cells 1 and 11 in each adjacent group, and so forth. The first and second sheets 41, 42 are the same as the above-mentioned first and second sheets 21, 22. The five sets of conduction paths 46 (conductive films) formed on the inner surface of the first sheet 41 are simpler in shape than the above-mentioned conduction paths 26, but these conduction paths 46 have the same structure as the conduction paths 26, and each conduction path 46 comprises parallel connection components 46a, 46b and serial connection components 46c.

Four conductive films 47, two conductive films 48, 49 on the left and right ends, a positive electrode terminal 43 that is integral with the conductive film 48, and a negative electrode terminal 44 that is integral with the conductive film 49 are formed on the inner surface of the second sheet 42, and these conductive films 47 to 49 are produced by silver-plating the surface of copper foil just as with the above-mentioned conduction paths 27 to 29.

The method for producing this solar module 40 is substantially the same as the method for manufacturing the above-mentioned solar module 20, and will therefore only be described briefly here.

First, the first and second sheets 41, 42, 25 of the spherical solar cells 1, and 25 of the spherical solar cells 11 are readied. Then, five sets of conduction paths 46 are formed on the inner surface of the first sheet 41, and the conductive films 47 to 49 are formed on the inner surface of the second sheet 42. Next, as shown in FIG. 11, the negative electrodes 7 of the various columns of spherical solar cells 1 in the second sheet 42 are bonded with a synthetic resin adhesive at specific corresponding locations on the conductive films 47, 49, and the positive electrodes 16 of the various columns of spherical solar cells 1 are bonded with a conductive synthetic resin adhesive at specific corresponding locations on the conductive films 47, 48. A sealant 51 is then applied so as to surround the periphery of these spherical solar cells 1, 11. The positive electrodes 6 of the various columns of spherical solar cells 1 bonded to the second sheet 42 and the negative electrodes 17 of the various columns of spherical solar cells 11 are then each coated with a conductive synthetic resin adhesive. Next, the inner surface of the first sheet 41 is brought together with the second sheet 42, and the various sets of conduction paths 46 are joined to the positive electrodes 6 and negative electrodes 17 of the two adjacent columns of spherical solar cells 1, 11. At this point the positive electrodes 6 of the various columns of spherical solar cells 1 are bonded to the pads 50 of the parallel connection components 46a, and the negative electrodes 17 of the various columns of spherical solar cells 11 are bonded to the pads 50 of the parallel connection components 46b. The sealant 51 is then bonded to the inner surface of the first sheet 41, and this product is then heated to cure the sealant 51. After this, the space on the inside is filled with the same insulating transparent liquid as the above-mentioned insulating transparent liquid through an opening 51a in the sealant 51, and the liquid is cured into a filler 52 by heating or irradiation with ultraviolet light, which completes the solar module 40. The equivalent circuit of this solar module 40 is the same as the equivalent circuit in FIG. 9. The spherical solar cells 1 of each column (each group) are connected in parallel by the conductive films 47 and 49 and the parallel connection components 46a of the conduction paths 46, and the spherical solar cells 1, 11 are serially connected with their adjacent groups of spherical solar cells 11, 1 by the serial connection components 46c of the conduction paths 46 or the conductive film 47. This solar module 40 generates power by receiving incoming light that is incident only on the first sheet 41, and the conductive films 47 to 49 also function as reflective films that reflect light. The rest of the action and effect are substantially the same as those of the above-mentioned solar module 20.

Modification 2 (see FIGS. 13 to 18)

This solar module 60 makes use of the above-mentioned spherical solar cells 1, 11, and its structure is substantially the same as that of the solar modules 20 and 40, and it can be produced in substantially the same way, so the structure of this solar module 60 and its method of manufacture will only be described briefly.

This solar module 60 comprises first and second sheets 61, 62, six rows and 14 columns (for example) of spherical solar cells 1, 11 incorporated in between these sheets 61, 62, a parallel connection mechanism for the parallel connection of the spherical solar cells 1, 11 in each column, a serial connection mechanism for the serial connection of the spherical solar cells 1, 11 in each column with the spherical solar cells 1, 11 in each adjacent group, and so forth. The first and second sheets 61, 62 comprise sheets of transparent, reinforced water-white glass with a thickness of 3 to 4 mm, and as shown in FIG. 13, pyramid cuts 63 are formed in a matrix of six rows and seven columns on the upper surface of the first sheet 61, and the apexes of the pyramid cuts 63 are located straight above the various spherical solar cells 1 and 11. It is preferable for the faces of the pyramid cuts 63 to form an apex angle of 45 degrees or less, but do not necessarily have to do so.

FIG. 14 illustrates the first sheet 61 turned upside-down. Seven conductive films 64 composed of thin films of a transparent conductive metal oxide (such as ITO, SnO2, or ZnO) are formed in seven columns on the inner surface of the first sheet 61 shown in this figure. As shown in FIG. 15, eight conductive films 65 that are the same as the above-mentioned conductive films 64, a positive electrode terminal 66 connected to the conductive films 65 at the left end, a negative electrode terminal 67 on the right end, and two sets of anti-reverse current diodes 68 between the negative electrode terminal 67 and the conductive films 65 on the right end are formed on the inner surface of the second sheet 62. In the production of this solar module 60, the first and second sheets 61, 62, the 42 spherical solar cells 1, and the 42 spherical solar cells 11 are produced ahead of time.

Next, the plurality of conductive films 64, 65 are formed on the inner surfaces of the first and second sheets 61, 62, respectively, and the positive electrode terminal 66, the negative electrode terminal 67, and the two anti-reverse current diodes 68 are formed on the second sheet 62.

Then, as shown in FIG. 14, six of the spherical solar cells 1 (one group of spherical solar cells) are bonded with a conductive adhesive to the right ends of the conductive films 64 of the first sheet 61, in which case the positive electrode 6 of each spherical solar cell 1 is bonded to a conductive film 64. Similarly, as shown in FIG. 15, six of the spherical solar cells 11 (one group of spherical solar cells) are bonded with a conductive adhesive to the right ends of the conductive films 65 of the second sheet 62, in which case the positive electrode 16 of each spherical solar cell 11 is bonded to a conductive film 65. Further, a rectangular sealant 69 is applied around the outer periphery of the first sheet 61, and a rectangular sealant 70 is applied around the outer periphery of the second sheet 62. Openings 69a and 70a are formed in the sealants 69 and 70, respectively.

Next, the negative electrodes 7 of the spherical solar cells 1 of the first sheet 61 are coated with a conductive adhesive, and the negative electrodes 17 of the spherical solar cells 11 of the second sheet 62 are also coated with a conductive adhesive. In this state, the first sheet 61 is turned over so that its inner surface is facing downward, the first sheet 61 is brought together with the second sheet 62, the negative electrodes 7 of the various columns of spherical solar cells 1 of the first sheet 61 are joined to the corresponding conductive films 65 of the second sheet 62, the negative electrodes 17 of the various columns of spherical solar cells 11 of the second sheet 62 are joined to the conductive films 64 of the first sheet 61, and the upper and lower sealants 69, 70 are butted together and joined. After this, the sealants 69, 70 are cured by heat treatment.

The space on the inside of the sealants 69, 70, which is the space between the first and second sheets 61, 62, is filled with a melt of a transparent, insulating, synthetic acrylic resin, and this melt is cured into a filler 71. This filler 71 improves the strength and durability of the solar module 60. FIG. 18 shows an equivalent circuit of this solar module 60. Two anti-reverse current diodes 68 are provided as shown near the negative electrode terminal 67. Specifically, when the solar module 60 is connected to a battery, if any reverse current flows from the battery to the positive electrode terminal 66 during the night or when the solar module 60 is shut down, there is the danger than the solar cells 1, 11 may be damaged, but the above-mentioned anti-reverse-current diodes 68 prevent the flow of this reverse current.

As shown in FIG. 18, with the solar module 60, the spherical solar cells 1, 11 in each column are connected in parallel by the conductive films 64, 65, columns of spherical solar cells 1 and columns of spherical solar cells 11 are disposed alternately, and the spherical solar cells 1, 11 of each column (each group) are serially connected to the spherical solar cells 1, 11 in each adjacent column (group) through the conductive films 64, 65, so the action and effect of this solar module 60 are substantially the same as those of the above-mentioned solar modules 20, 40.

FIG. 17 is a detail view illustrating the behavior of light incident on the solar module 60. Because the numerous pyramid cuts 63 are formed on the surface of the first sheet 61, not only light that is incident perpendicularly, but also light that is incident from many other directions is readily guided toward the spherical solar cells 1, 11, which improves the utilization efficiency of the incident light.

With this solar module 60, the first and second sheets 61, 62 are made of transparent glass, and the conductive films 64, 65 are also made from transparent, conductive synthetic resin, so photoelectromotive force is generated both by light incident through the first sheet 61 and by light incident through the second sheet 62. Furthermore, since a specific gap is provided between the spherical solar cells 1, 11 so that part of the light can pass through, natural lighting is afforded, which means that this solar module 60 can be applied as window glass, or can be applied to window glass.

Also, instead of the numerous pyramid cuts 63, numerous fine, regular bumps may be formed on the surface of the first sheet 61, or the numerous pyramid cuts 63 or numerous fine, regular bumps may be formed on the surface of the second sheet 62 as well.

Modification 3 (see FIGS. 19 to 22)

This solar module 80 comprises the first and second sheets 81, 82, three groups of a total of 72 spherical solar cells 11 incorporated in between these sheets 81, 82, a parallel connection mechanism for the parallel connection of the spherical solar cells 11 in each group, a serial connection mechanism for the serial connection of the 24 spherical solar cells 11 in each group with the 24 spherical solar cells 11 in each adjacent group, and so forth.

The 24 spherical solar cells 11 of each group are laid out in a matrix of six rows and four columns with the positive electrodes 16 facing down and the negative electrodes 17 facing up, and are connected in parallel by conduction directions 83 to 86 of the first and second sheets 81, 82. A column of six spherical conductors 87 is disposed on the left side of the middle group, a column of six spherical conductors 87 is disposed on the left side of the right group, the spherical solar cells 11 of the right group and the spherical solar cells 11 of the middle group are serially connected by six spherical conductors 87, and the spherical solar cells 11 of the middle group and the spherical solar cells 11 of the left group are serially connected by six spherical conductors 87.

The first sheet 81 is made of the same glass as the above-mentioned first sheet 61 on which pyramid cuts were formed. The second sheet 82 is made of glass epoxy or another such FRP printed substrate.

FIG. 19 illustrates the first sheet 81 turned upside-down. Three conductive films 83 composed of thin films of a transparent conductive metal oxide are formed on the inner surface of the first sheet 81. As shown in FIG. 20, four conductive films 84 to 86 capable of reflecting light are formed on the inner surface of the second sheet 82. These conductive films 84 to 86 are produced by silver-plating the surface of copper foil on whose surface fine bumps have been formed.

A pin-shaped positive electrode terminal 88 that is connected to the conductive film 84 and passes through the second sheet 82 is formed at the left end of the second sheet 82. A pin-shaped negative electrode terminal 89 that is connected to the conductive film 86 and passes through the second sheet 82 is formed at the right end of the second sheet 82. A spherical diode 90 that prevents the reverse flow of current from the positive electrode terminal 88 to the solar module 80 is connected between the conductive films 83 of the first sheet 81 and the conductive film 86 of the second sheet 82. The above-mentioned spherical conductors 87 are produced by silver-plating the surface of tiny spheres of iron alloy, with a pair of electrodes formed at the top and bottom (these can be omitted), and the height of the spherical conductors 87 is the same as the height of the spherical solar cells 11.

As shown in FIG. 22, the spherical diode 90 comprises a spherical crystal 95 composed of p type silicon, an n type diffusion layer 96, a pn junction 97, a pair of electrodes 91, 92 (anode 91 and cathode 92), a metal film 92a that covers the upper half on the cathode 92 side, and an insulating film 98. The anode 91 of the spherical diode 90 is connected to the conductive film 86.

The method for producing this solar module 80 is substantially the same as the method for manufacturing the above-mentioned solar modules 20, 40, 60, and will therefore only be described briefly here.

First, the first and second sheets 81, 82, 72 of the spherical solar cells 11, 12 of the spherical conductors 87, and the spherical diode 90 are readied.

Then, the conductive films 83 are formed on the inner surface of the first sheet 81, the conductive films 84 to 86 are formed on the inner surface of the second sheet 82, and the positive electrode terminal 88 and negative electrode terminal 89 are also formed. Next, 24 of the spherical solar cells 11 are disposed in six rows and four columns on the conductive films 84, 85 of the second sheet 82, and the positive electrodes 16 of the spherical solar cells 11 are bonded to the conductive films 84, 85 with a conductive adhesive. The spherical diode 90 is disposed in the middle of the conductive film 86, and its anode 91 is bonded to the conductive film 86 with a conductive adhesive.

Next, the negative electrodes 17 of all of the solar cells 11, the tops of all of the spherical conductors 87, and the cathode 92 of the spherical diode 90 are coated with a conductive adhesive. A sealant 93 is applied around the periphery of the inner surface of the second sheet 82, and an opening 93a is formed. In this state, the normally oriented first sheet 81 is brought together with the second sheet 82 from above, the conductive films 83 of the first sheet 81 are bonded to the corresponding negative electrodes 17 of the spherical solar cells 11 of each group, and the tops of the spherical conductors 87 of each column are bonded to the corresponding conductive films 83. With the sealant 93 bonded to the first sheet 81, the sealant 93 is heated and cured. After this, the interior is filled with a melt of a transparent synthetic resin such as an acrylic resin through the opening 93a in the sealant 93, and this melt is cured into a transparent filler 94. This completes the solar module 80.

The action and effect of this solar module 80 will now be described. The function of this solar module 80, however, is substantially the same as that of the above-mentioned solar modules 20, 40, 60, and therefore will only be described briefly.

With this solar module 80, the 24 spherical solar cells 11 of each group are connected in parallel by the upper and lower conductive films 83 to 85, the spherical solar cells 11 of the left group and the spherical solar cells 11 of the middle group are serially connected by six spherical conductors 87, and the spherical solar cells 11 of the middle group and the spherical solar cells 11 of the right group are serially connected by six spherical conductors 87.

When external light incident on the first sheet 81 reaches the spherical solar cells 11, the spherical solar cells 11 of each group generate approximately 0.6 V of photoelectromotive force, and the current generated by the photoelectromotive force (approximately 1.8 V) is outputted from the positive electrode terminal 88 to a battery or an external load. With this solar module 80, since spherical solar cells 11 are provided in a plurality of rows and a plurality of columns in each group, the output current can be increased and the output voltage decreased as needed for the solar module 80 as a whole. It is also possible to raise the output voltage by serially connecting a plurality of these solar modules 80. Also, since the anti-reverse current diode 90 is provided, the flow of reverse current from the outside to the positive electrode terminal 88 of the solar module 80 is effectively prevented, and damage to the solar cells 11 that would otherwise be caused by reverse current can be prevented.

Just one type of spherical solar cell 11 is used with this solar module 80, which is advantageous in terms of the production of the spherical solar cells 11 and the assembly of the solar module 80. The structure of the conductive films 83 to 85 is simple because a plurality of rows and a plurality of columns of spherical solar cells 11 are provided to each group. Since the conductive films 84 to 86 of the second sheet 82 have an optical reflection function, light that is incident through the first sheet 81 is reflected and scattered and then more readily absorbed by the spherical solar cells 11.

Also, instead of the spherical conductors 87 of each column discussed above, it is possible to use a single metal rod, and a plurality of spherical diodes 90 may be provided.

Furthermore, the first sheet 81A shown in FIG. 23 may be employed in place of the first sheet 81 discussed above. With this first sheet 81A, three sets of printed wiring 99 are formed as conductive films as shown in FIG. 23 instead of the three conductive films 83.

Next, various examples of modifying the above embodiments and modifications will be described.

1) The granular spherical solar cells 100 and 110 shown in FIGS. 24 and 25 are the same size and have the same power generating function as the above-mentioned spherical solar cells 1, 11, so they can be applied to a semiconductor module along with or instead of the spherical solar cells 1, 11. The solar cell 100 in FIG. 24 comprises a single spherical crystal 101 of n type silicon, a flat surface 102 formed at one end of this spherical crystal 101, a p type diffusion layer 103, a pn junction 104, a negative electrode 107 formed on the flat surface 102, a positive electrode 106 that faces the negative electrode 107 with the spherical crystal 101 sandwiched therebetween, an antireflective film 105 composed of an insulating film, and so forth. The spherical solar cell 110 shown in FIG. 25 comprises a single spherical crystal 111 of p type silicon, flat surfaces 112 and 113 of different size and formed at both ends of this spherical crystal 111, an n type diffusion layer 114, a pn junction 115, a positive electrode 117 formed on the larger flat surface 112, a negative electrode 118 that is formed on the smaller flat surface 113 and faces the positive electrode 117 with the spherical crystal 111 sandwiched therebetween, an antireflective film 116 composed of an insulating film, and so forth.

2) The granular cylindrical solar cell 120 shown in FIG. 26 is the same size and has the same power generating function as the above-mentioned spherical solar cells 1, 11, so it can be applied to a semiconductor module along with or instead of the spherical solar cells 1, 11. The material used to produce this cylindrical solar cell 120 is a cylinder with a diameter of 1.5 mm made of p type silicon with a low resistivity of about 1 m. This cylindrical solar cell 120 comprises a cylindrical crystal 121 composed of p type silicon, an n type diffusion layer 122, a pn junction 123, a p+ type diffusion layer 124, a pair of electrodes 125 and 126 (positive electrode 125 and negative electrode 126) provided at both ends in the axial direction of the cylindrical solar cell 120, an antireflective film 127 composed of an insulating film, and so forth.

3) The above solar modules are examples of light-receiving semiconductor modules, but a light-emitting semiconductor module that emits planar light can be produced by using granular light-emitting diodes (LEDs) that emit light by electro-optic conversion and that have the same structure as the above-mentioned spherical solar cells 1, 11 instead of the spherical solar cells 1, 11 in the above-mentioned solar modules. In the case of a light-emitting diode, the electrode in contact with the diffusion layer or p type crystal becomes the anode, the electrode in contact with the n type diffusion layer or crystal becomes the cathode, and when current flows forward from the anode to the cathode, light with a wavelength corresponding to the material of the crystal or diffusion layer is generated from near the pn junction and radiated to the outside. It is also possible to employ the spherical light-emitting diode proposed in WO98/15983 by the inventor, or a granular and spherical light-emitting diode with a similar structure.

With a light-emitting semiconductor module, possible configurations include a module in which transparent first and second sheets are used and light is emitted from both sides, and a module that makes use of a transparent first sheet and an opaque second sheet that reflects light toward the first sheet, and light is emitted from just one side, among others.

4) With the above-mentioned solar module 20, the example described was a case of forming the numerous protrusions 25 on just the outside of the first sheet 21, but numerous protrusions 25 may also be formed on the outside of the second sheet 22, just as on the outside of the first sheet 21. Furthermore, numerous fine pyramid cuts may be formed instead of the numerous protrusions 25 of the first sheet 21. However, the numerous protrusions 25 of the solar module 20, and the pyramid cuts or fine bumps on the surface of the first sheet of the solar modules 40, 60 are not essential, and it is also possible for the surface of the first sheet to be formed flat, without any bumps.

5) The spherical solar cells 1, 11 were described using as an example a light-receiving semiconductor cell produced from a silicon semiconductor, but a light-receiving semiconductor cell with an opto-electric conversion function can also be made from SiGe, GaAs and compounds thereof, InP and compounds thereof, CuInSe2 and compounds thereof, CdTe and compounds thereof, and other such semiconductors.

Alternatively, when light-emitting semiconductor cells are incorporated to create a light-emitting semiconductor module, the light-emitting semiconductor cells with an electro-optic conversion function can be made from GaAs and compounds thereof, InP and compounds thereof, GaP and compounds thereof, GaN and compounds thereof, SiC and compounds thereof, and other such semiconductors.

6) A ceramic wiring substrate or a metal wiring glass substrate may be employed instead of the printed substrate used in the solar modules 20 and 40. Sheets composed of transparent synthetic resin may also be employed instead of sheets composed of transparent glass.

7) Solder or an indium alloy may be employed instead of the above-mentioned conductive adhesive. The above-mentioned fillers 34, 52, 71, and 94 are not essential, and may be omitted.

Similarly, the anti-reverse-current diodes 68 and the spherical diode 90 are not essential, and may be omitted.

The invention claimed is:

1. A light-emitting or light-receiving semiconductor module, comprising:

a pair of sheets including a first sheet made of a transparent insulating material, a second sheet made of an insulating material and disposed parallel to the first sheet, and a plurality of granular semiconductor cells disposed in a configuration forming a plurality of rows and a plurality of columns in between the first and second sheets wherein said semiconductor cells are each disposed in one of said rows and one of said columns, wherein each of said semiconductor cells comprises a p or n type semiconductor granule, a pn junction formed by an outer layer of the semiconductor granule, and first and second electrodes formed at first and second opposing portions of the semiconductor granule and respectively connected to first and second ends of the pn junction wherein the first ends of the pn junctions are at one of a p type material and an n type material of the pn junctions and the second ends of the pn junction are at another one of the p type material and the n type material of the pn junctions, and the pn junction has a light-emitting or light receiving function, each of said semiconductor cells is disposed in a state such that a conduction direction defined by orientation of said first and second electrodes is perpendicular to the pair of sheets, said semiconductor cells are grouped into a plurality of groups each of which includes a plurality of said semiconductor cells having a common conduction direction, and said groups being arranged adjacent one another, conductors disposed on inner surfaces of said first and second sheets which oppose one another, said conductors connecting said semiconductor cells such that, for each respective one of said groups, said semiconductor cells thereof are electrically connected in parallel to each adjacent others of said semiconductor cells of said respective one of said groups thereby electrically connecting together the first electrodes of said semiconductor cells of said respective one of said groups, and thereby electrically connecting together said second electrodes of said semiconductor cells of said respective one of said groups; and said conductors electrically connecting said groups in a series connection with each other such that said first electrodes of said semiconductor cells of ones of said groups are electrically connected to said second electrodes of adjacent ones of said groups to be thereby aligned to electrically conduct in a common electrical direction in said series connection, wherein:

said groups include first groups and second groups arranged with said first groups interdisposed between said second groups in a planar direction of said first and second sheets;

said first groups have a conduction direction physically opposite in direction to a conduction direction of said second groups;

said conductors on said first sheet are directly bonded to the first electrodes of said first groups and the second electrodes of said second groups to effect said serial connection; and said conductors on said second sheet are directly bonded to the second electrodes of said first groups and the first electrodes of said second groups to effect said serial connection.

2. The light-emitting or light-receiving semiconductor module according to claim 1, wherein each of said semiconductor cells has a light-receiving function involving opto-electric conversion.

3. The light-emitting or light-receiving semiconductor module according to claim 1, wherein each of said semiconductor cells has a light-emitting function involving electro-optical conversion.

4. The light-emitting or light-receiving semiconductor module according to claim 1, wherein said granular semiconductor cells are spherical semiconductor cells.

5. The light-emitting or light-receiving semiconductor module according to claim 1, wherein said granular semiconductor cells are cylindrical semiconductor cells.

6. The light-emitting or light-receiving semiconductor module according to claim 1, wherein said second sheet is composed of a translucent sheet.

7. The light-emitting or light-receiving semiconductor module according to claim 2, wherein said first sheet is composed of a glass sheet, and numerous fine pyramid cuts or bumps are formed on an outer surface of the glass sheet.

8. The light-emitting or light-receiving semiconductor module according to claim 1, wherein said pair of sheets is composed of flexible sheets made of a synthetic resin.

9. The light-emitting or light-receiving semiconductor module according to claim 1, wherein an insulating, transparent synthetic resin is packed into the space between the plurality of semiconductor cells between said pair of sheets.

10. The light-emitting or light-receiving semiconductor module according to claim 1, wherein said conductors include a first conductive film portion formed on the inner surface of each or the first and second sheets to effect said parallel connections of said semiconductor elements, and a second conductive film portion formed on the inner surface of each of the first and second sheets to effect said serial connection of said groups.

11. The light-emitting or light-receiving semiconductor module according to claim 10, wherein the first and second conductive film portions on the inner surface of said first sheet are composed of a transparent metal oxide conductive film.

12. The light-emitting or light-receiving semiconductor module according to claim 11, wherein the first and second conductive film portions on the inner surface of said second sheet are composed of metal conductive films that function as light reflecting films.

13. The light-emitting or light-receiving semiconductor module according to claim 10, wherein the first and second conductive film portions on the inner surface of said fast sheet are composed of printed wiring.

14. The light-emitting or light-receiving semiconductor module according to claim 13, wherein the first and second conductive film portions on the inner surface of said second sheet are composed of printed wiring.

15. The light-emitting or light-receiving semiconductor module according to claim 13, wherein the first and second conductive film portions on the inner surface of said second sheet are composed of metal conductive films that function as light reflecting films.

16. The light-emitting or light-receiving semiconductor module according to claim 2, wherein said second sheet is constituted by a translucent sheet, and said module is structured so as to be capable of receiving external light incident from a front side and a back side of said pair of sheets.

17. The light-emitting or light-receiving semiconductor module according to claim 16, wherein a specific gap is provided between said semiconductor cells, and said module is structured so that part of the back side of said pair of sheets can be seen through the front side, or part of the front side can be seen through the back side.

18. The light-emitting or light-receiving semiconductor module according to claim 3, wherein said second sheet is constituted by a translucent sheet, and said module is structured so that light can radiate from a front side and a back side of said pair of sheets and to the back side from the front side.

19. The light-emitting or light-receiving semiconductor module according to claim 1 wherein said conductors respectively include a parallel connection portion interconnecting like ones of said first and second electrodes, and at least one serial connection portion interconnecting non-alike ones of said first and second electrodes respectively of adjacent ones of said groups.

20. The light-emitting or light-receiving semiconductor module according to claim 19 wherein said groups each consist of the semiconductor cells in one of the columns.

21. A light-emitting or light-receiving semiconductor module, comprising:

a pair of sheets including a first sheet made of a transparent insulating material, a second sheet made of an insulating material and disposed parallel to the first sheet, and a plurality of granular semiconductor cells disposed in a configuration forming a plurality of rows and a plurality of columns in between the first and second sheets wherein said semiconductor cells are each disposed in one of said rows and one of said columns, wherein each of said semiconductor cells comprises a p or n type semiconductor granule, a pn junction formed by an outer layer of the semiconductor granule, and first and second electrodes formed at first and second opposing portions of the semiconductor granule and respectively connected to first and second ends of the pn junction wherein the first ends of the pn junctions are at one of a p type material and an n type material of the pn junctions and the second ends of the pn junction are at another one of the p type material and the n type material of the pn junctions, and the pn junction has a light-emitting or light receiving function, each of said semiconductor cells is disposed in a state such that a conduction direction defined by orientation of said first and second electrodes is perpendicular to the pair of sheets, said semiconductor cells are grouped into a plurality of groups each of which includes a plurality of said semiconductor cells having a common conduction direction, and said groups being arranged adjacent one another, conductors disposed on inner surfaces of said first and second sheets which oppose one another, said conductors connecting said semiconductor cells such that, for each respective one of said groups, said semiconductor cells thereof are electrically connected in parallel to each adjacent others of said semiconductor cells of said respective one of said groups thereby electrically connecting together the first electrodes of said semiconductor cells of said respective one of said groups, and thereby electrically connecting together said second electrodes of said semiconductor cells of said respective one of said groups;

said conductors electrically connecting said groups in a series connection with each other such that said first electrodes of said semiconductor cells of ones of said groups are electrically connected to said second electrodes of adjacent ones of said groups to be thereby aligned to electrically conduct in a common electrical direction in said series connection;

conductor bodies interposed between and electrically connecting said conductors on said first sheet and said conductors on said second sheet to effect said series connection;

said groups including first groups and second groups arranged with said first groups interdisposed between said second groups in a planar direction of said first and second sheets, said first groups have a conduction direction physically directionally aligned with a conduction direction of said second groups;

said conductors on said first sheet being bonded to said first electrodes of said first and second groups and said conductor bodies; and said conductors on said second sheet being bonded to the second electrodes of said first and second groups and said conductor bodies such that said series connection is effected via said conductor bodies.

22. The light-emitting or light-receiving semiconductor module according to claim 21, wherein said conductor bodies are interdisposed between said first groups and said second groups and aligned in a direction parallel the planar direction of said first and second sheets.

23. The light-emitting or light-receiving semiconductor module according to claim 21, wherein said conductor bodies are interdisposed between said first groups and said second groups and aligned in a direction parallel the planar direction of said first and second sheets in columns between opposing columns of said first and second groups.

24. The light-emitting or light-receiving semiconductor module according to claim 21, wherein said conductor bodies have a dimension in the direction perpendicular to said first and second sheets substantially the same as a dimension of said semiconductor elements in the direction perpendicular to said first and second sheets.

25. The light-emitting or light-receiving semiconductor module according to claim 21, wherein said first and second groups each respectively have said semiconductor elements thereof arranged in a matrix comprising rows and columns of said semiconductor elements extending parallel to the planar direction of said first and second sheets.

* * * * *